United States Patent
Lam

(10) Patent No.: US 7,092,253 B2
(45) Date of Patent: Aug. 15, 2006

(54) BACK PLANE AND MID-PLANE ASSEMBLIES AND RELATED SYSTEMS AND METHODS

(75) Inventor: An Hien Lam, Houston, TX (US)

(73) Assignee: Hewlett-Packard Development Company, LP., Houston, TX (US)

( * ) Notice: Subject to any disclaimer, the term of this patent is extended or adjusted under 35 U.S.C. 154(b) by 188 days.

(21) Appl. No.: 10/816,696

(22) Filed: Apr. 1, 2004

(65) Prior Publication Data

US 2005/0219805 A1    Oct. 6, 2005

(51) Int. Cl.
*G06F 1/16* (2006.01)
(52) U.S. Cl. ............ 361/690; 361/688; 361/676; 361/724; 361/727; 312/223.3; 454/184
(58) Field of Classification Search ............... 361/676, 361/678, 686–687, 690, 692–695, 712–724, 361/727, 748; 312/223.11, 223.3; 454/184
See application file for complete search history.

(56) References Cited

U.S. PATENT DOCUMENTS

| | | | | |
|---|---|---|---|---|
| 4,237,546 A | * | 12/1980 | Wells | .......................... 710/100 |
| 5,954,823 A | * | 9/1999 | Cutts et al. | .................... 714/14 |
| 6,449,150 B1 | * | 9/2002 | Boone | .......................... 361/694 |
| 6,462,532 B1 | * | 10/2002 | Smith | ....................... 324/158.1 |
| 6,613,984 B1 | | 9/2003 | Hensley | |
| 6,639,795 B1 | | 10/2003 | Cooper | |
| 6,665,179 B1 | | 12/2003 | Chou | |
| 2003/0030977 A1 | * | 2/2003 | Garnett et al. | .............. 361/687 |
| 2005/0057909 A1 | * | 3/2005 | El-Batal et al. | ............. 361/796 |

* cited by examiner

*Primary Examiner*—Michael Datskovskiy

(57) ABSTRACT

Back plane and mid-plane assemblies and related systems and methods are described. In one embodiment, a system comprises an enclosure and a plane assembly mounted within the enclosure and configured to connect with multiple pluggable devices. The plane assembly comprises a first plane portion having multiple connectors; and at least a second plane portion having multiple connectors, with the second plane portion being offset from the first plane portion.

25 Claims, 4 Drawing Sheets

BACK PLANE AND MID-PLANE ASSEMBLIES AND RELATED SYSTEMS AND METHODS

BACKGROUND

Back planes and mid-planes are structures that are mounted on or in an enclosure inside of which multiple modular, pluggable, board-supported devices reside. Back planes and mid-planes can comprise Printed Circuit Boards (PCBs) that serve as an electrical and mechanical connection for the modular pluggable devices. One example of a modular pluggable device is a blade, such as a server blade, storage blade or a network blade.

A blade can comprise a comprehensive computing system that can include a processor, memory, network connections, and associated electronics—all mounted on a single motherboard or blade. Blades can be installed in a rack-mountable enclosure that houses multiple blades that share common resources such as cabling, power supplies, and cooling fans.

One of the problems with modular devices, such as those mentioned above, pertains to maintaining adequate airflow through the enclosure in which the blades reside so that the blades do not overheat. Specifically, blades can be mounted closely together in their enclosure in a parallel, side-by-side fashion, and can extend from the front of the enclosure towards the back of the enclosure to a connection point at a connector on either a mid-plane or back plane. Because the blades are mounted closely together and because the mid- or back plane usually extends perpendicularly to the desired direction of airflow, maintaining adequate airflow can be a challenge.

In the past, attempts have been made to improve airflow through such enclosures by reducing the height of the back or mid-plane, or by cutting holes in the back or mid-plane. By reducing the available surface area of the back or mid-plane, the routing space that is available for routing electrical connections to and between the modular devices is reduced. This, in turn, can drive the cost of the back or mid-planes higher because the back or mid-plane may require more layers in order to adequately route the electrical connections to and between the modular devices. In addition, because of the reduced routing space, higher-density connectors may be needed in order to accommodate a higher density of pins within a given area on the back or mid-plane.

DETAILED DESCRIPTION

Overview

In accordance with the described embodiments, back and mid-plane assemblies are provided in which the back or mid-plane is staggered into two or more portions that are offset within an associated enclosure. By offsetting the back or mid-plane portions, a gap is provided between the portions and can accommodate airflow through the enclosure. In at least some embodiments, the total combined height of the back or mid-planes can approach that of the enclosure in which the back or mid-planes are mounted. In these embodiments, the amount of routing space provided by the back or mid-planes can approach that which is generally considered as optimal, while at the same time provide a desired degree of airflow through the enclosure.

Exemplary Staggered Back Plane Embodiment

Figure 1:
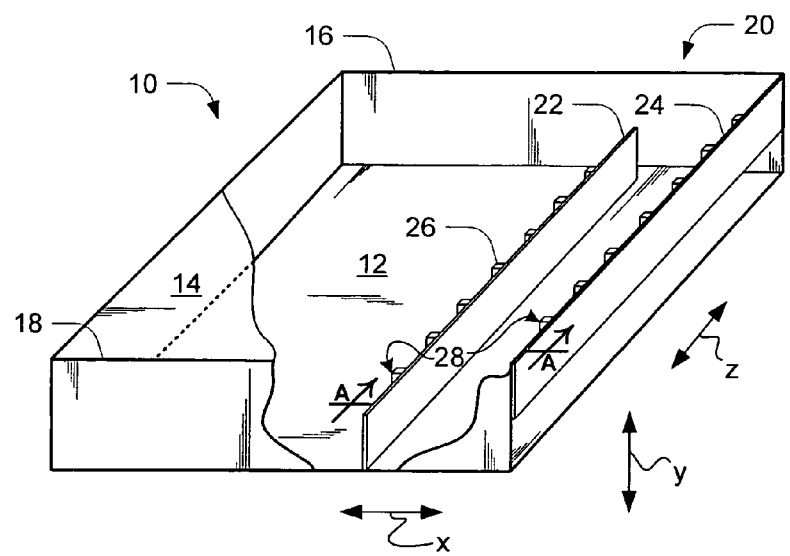
FIG. 1 is an isometric view of an exemplary enclosure with a back plane assembly in accordance with one embodiment.

FIG. 1 shows portions of an exemplary enclosure 10 in accordance with one embodiment. Enclosure 10 comprises a base 12, a top 14 (a portion of which is broken away), and sidewalls 16, 18 (a portion of which is broken away) joined with the base and top to define an interior volume within which multiple modular, pluggable board-supported devices can be received. Any suitable type of device can be received within the interior volume of the enclosure and plug into the back plane. For example, in some embodiments, devices such as blades can be received within the volume.

In accordance with this embodiment, a staggered back plane assembly 20 is received within and supported by enclosure 10 and comprises a first back plane portion 22 and a second back plane portion 24 spaced apart from the first back plane portion. Back plane portions 22 and 24 are staggered or longitudinally offset within the enclosure (i.e. along the x-direction as shown), as well as being elevationally offset within the enclosure (i.e. along the y-direction as shown) relative to one another. In accordance with the described embodiment, back plane portion 22 is mounted on or proximate enclosure base 12, and back plane portion 24 is mounted on or proximate enclosure top 14.

In accordance with the described embodiment, each back plane portion comprises a number of connectors, such as connector 26, which are distributed along the length of an associated back plane portion. The connectors provide an electrical and mechanical connection for a device such as a blade, as will be appreciated by the skilled artisan.

In accordance with the described embodiment, a connector on one of the back plane portions is paired with a connector on a different back plane portion to provide a connector pair, such as connector pair 28. Individual connector pairs can provide an electrical and mechanical connection for a single respective device or blade. Thus, in the illustrated example, multiple devices or blades can be inserted into enclosure 10 and connected with individual connector pairs so as to be distributed along the z-direction within the enclosure. When mounted in enclosure 10 in this manner, the devices or blades are seated, side-by-side in a parallel fashion, as will be understood by the skilled artisan.

Figure 2:
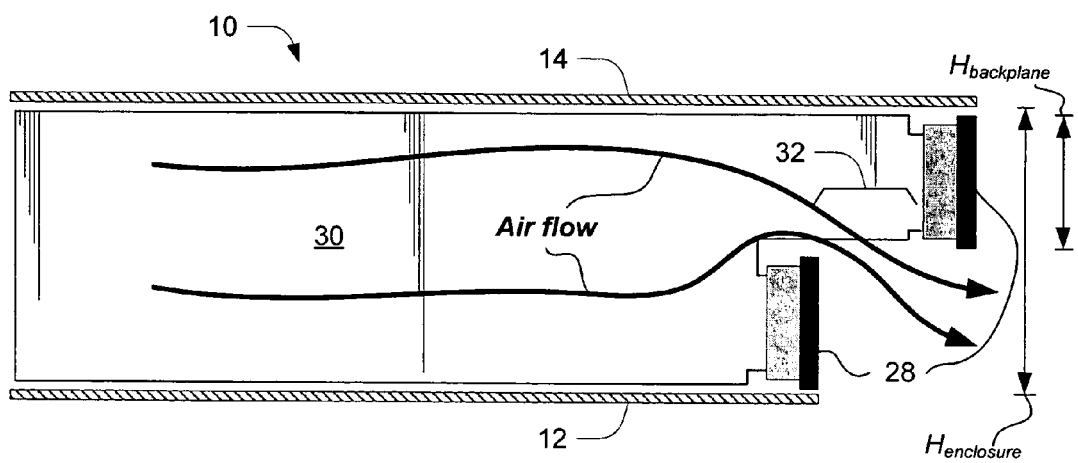
FIG. 2 is a view taken along line A—A in FIG. 1, and shows a device within the enclosure.
Figure 3:
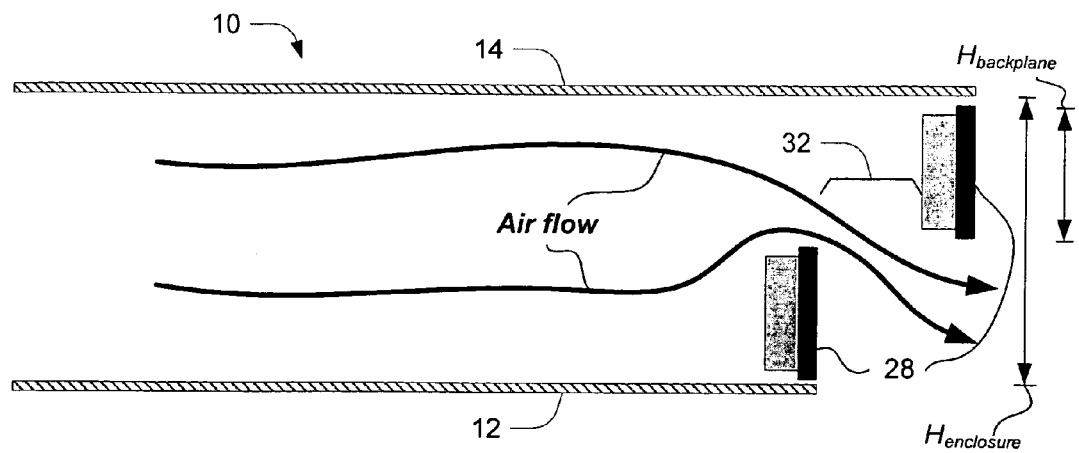
FIG. 3 is a view similar to the FIG. 2 view without the device within the enclosure.

FIGS. 2 and 3 are side elevational views of enclosure 10, taken along line A—A in FIG. 1. In this example, FIG. 2 shows a device comprising a blade 30 within the enclosure and connected with a connector pair 28. FIG. 3 shows the enclosure without the blade. As shown, the arrangement of the back plane portions of the back plane assembly provides connector pairs 28 that are spaced to provide a gap 32 that accommodates airflow through the enclosure, from front-to-back. As shown, air enters through an opening at the front of the enclosure (away from the connectors) and travels generally along the length of the individual blades towards the connectors, and exits via gap 32 between the spaced apart connectors of connector pair 28 at the back of the enclosure.

In the described embodiment, the spacing of the back plane portions creates a free cross sectional area (defined by the gap and running into and out of the plane of the page upon which FIGS. 2 and 3 appear) that provides less flow resistance for front-to-back airflow than current back plane designs. As will be appreciated by the skilled artisan, flow resistance is a function of parameters that include the free cross sectional area, density, and a friction factor—and can be represented by the following well-known formula, as set forth in "Introduction to Fluid Flow, Friction, and Flow Resistance", C. E. Bash & C. D. Patel, 1999:

$$\Delta P = \text{Flow Lost Coefficient} = Rv^2, R = k\rho/2A^2;$$

Where
$v$=velocity(m/s); $\rho$=density(kg/m$^3$); k=frictional factor$\leq 2$
A=Free cross sectional area (m$^2$)
R=Flow Resistance=$(1/m^2)/(m^3/s)^2$ For any given enclosure dimension and total back plane area, the staggered back plane assembly can provide improvements in flow resistance stemming from the added free cross sectional area that is provided by the gap between the individual back plane portions. Such improvements can be gleaned from the following equations which represent the flow resistances for a conventional back plane construction and a single back plane portion of a staggered back plane construction, where W is the width of the enclosure (not designated, but into and out of the plane of the page upon which FIGS. 2 and 3 appear), $H_{enclosure}$ is the height of the enclosure, and $H_{backplane}$ is the height of an individual back plane or back plane portion:

$$R = k\rho/2A^2$$

$$R_{conventional} = k\rho/2((W \times H_{enclosure}) - (W \times H_{backplane}))^2$$

$$R_{staggered} = k\rho/2((W \times H_{enclosure}) - (W \times H_{backplane}/2))^2$$

Therefore, $R_{staggered} < R_{conventional}$

Figure 4:
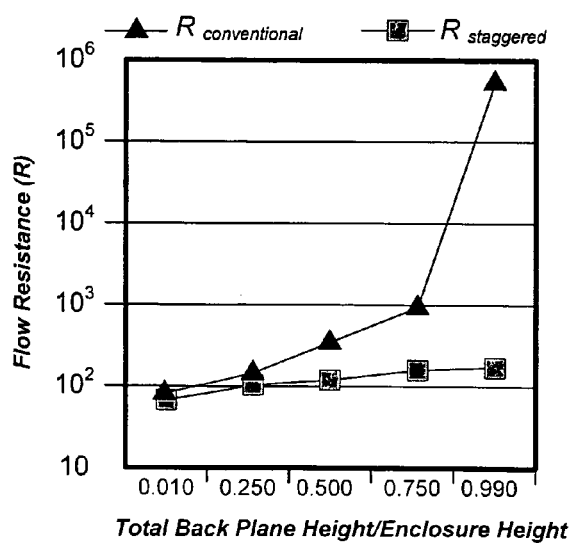
FIG. 4 is a graph that illustrates aspects of one or more embodiments.

This relationship can be graphically represented by a graph such as the one shown in FIG. 4. There, Flow Resistance R is plotted against Total Back Plane Height/Enclosure Height for a conventional back plane and a staggered back plane such as the one described above. In this example, and one which is explored in more detail in FIGS. 5 and 6 below, the height of each back plane portion is equal and the width of the gap between the back plane portions is equal to half of the enclosure height. As can be seen, the flow resistance increases dramatically by many orders of magnitude in the conventional designs as the back plane height approaches that of the enclosure. Yet, in the staggered back plane design, by virtue of the gap width, the flow resistance increases only modestly and not by an order of magnitude. It should be noted that with an appreciation of the above equations and the behavior that the equations describe, gap dimensions can be mathematically determined for given back plane dimensions that promote air flow and, in at least some instances, can constitute mathematically optimal gap dimensions. An example of one such embodiment is provided below.

As should be apparent from the discussion above, and particularly from FIG. 4, the staggered back plane design can provide an opportunity for back planes to be constructed having collective heights that approach that of the enclosures in which the back planes are mounted. This provides a near-optimal amount of routing space for routing electrical connections within the back plane. Additionally, because of the staggered design, airflow through the enclosure is promoted in a manner that can greatly reduce the chances that individual devices within the enclosure will overheat.

Gap Width Considerations in Some Embodiments

Although any suitable gap dimension can be utilized to promote airflow, in some embodiments, it has been found advantageous to define a practical bottom limit on the gap width (i.e. the horizontal distance, as shown in FIG. 3, between individual connectors of the connector pairs). More specifically, in some embodiments, it can be advantageous to provide back plane portions that attempt to provide as much routing space as possible. In these embodiments, each individual back plane portion can have a height that approaches or equals about half the height of the enclosure.

Figure 5:
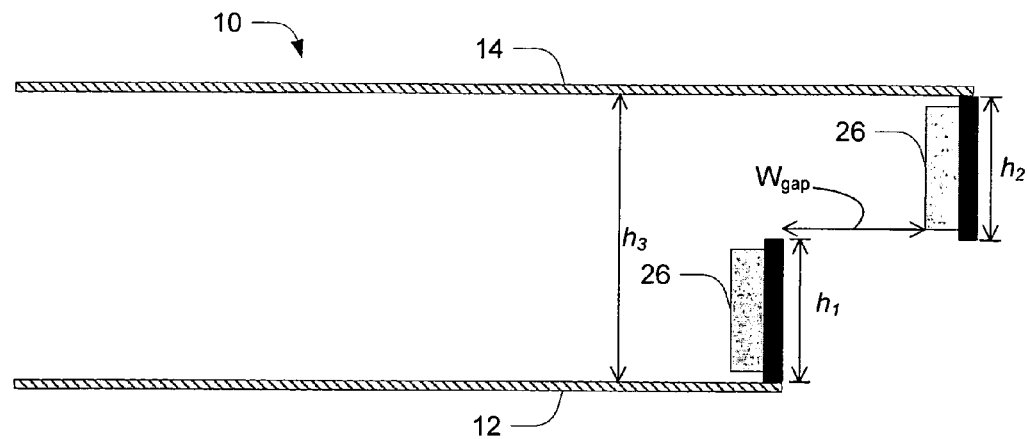
FIG. 5 is a side elevational view of an exemplary enclosure with a back plane assembly in accordance with one embodiment.
Figure 6:
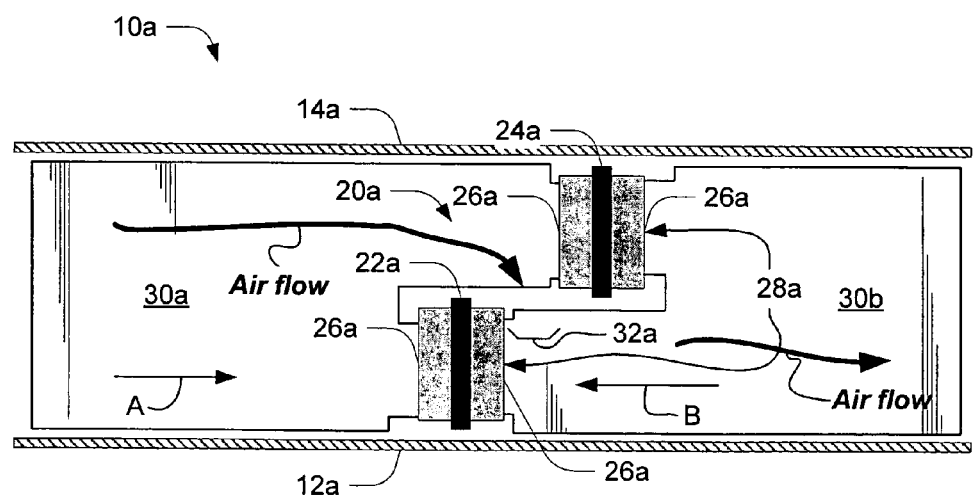
FIG. 6 is a side elevational view of an exemplary enclosure with a mid-plane assembly in accordance with one embodiment.

As an example, consider FIG. 5. There, individual connectors 26 of a single connector pair are shown. Each backplane has an associated height—$h_1$, $h_2$ respectively. Additionally, enclosure 10 has an enclosure height $h_3$. In this example, and to maximize the free cross sectional area through which air can flow, $h_1 + h_2 = h_3$, $h_1 = h_2 = \frac{1}{2} h_3$ and to promote airflow through this particularly-dimensioned enclosure, a minimum gap width $W_{gap}$ of one half the height of the enclosure, or $\frac{1}{2} h_3$, has been found to provide an adequate amount of space within the enclosure for the devices or blades, while at the same time provides a free cross sectional area for an airflow path that is generally smooth and unconstricted from front-to-back. For example, as the gap width between the individual connectors is reduced, the airflow path becomes more abrupt and constricted because there is less free cross sectional area through which the air can flow out of the enclosure. By defining, in some embodiments, a practical minimum gap width, a free cross sectional area is provided that is about one half of the cross sectional area of the enclosure. In these embodiments, a practical minimum gap width drawn along these lines has been found to provide an adequate amount of airflow through the enclosure.

The same dimensional considerations can apply to mid-plane embodiments, such as the one that is described directly below.

Exemplary Staggered Mid-plane Embodiment

In accordance with one embodiment, a staggered mid-plane assembly can be provided inside an enclosure. As an example, consider FIG. 6 which shows an exemplary enclosure 10a having a base 12a and a top 14a. A mid-plane assembly 20a is provided and is mounted within enclosure 10a. In accordance with this embodiment, mid-plane assembly 20a comprises a first mid-plane portion 22a and a second mid-plane portion 24a. The mid-plane portions are situated within the enclosure in a manner that is similar to the situation of the back plane assemblies described above. Specifically, the mid-plane portions 22a and 24a are staggered or offset horizontally (i.e. along the x-direction), as well as vertically (i.e. along the y-direction) relative to one another within the enclosure. In accordance with this embodiment, mid-plane portion 22a is mounted on or proximate enclosure base 12a, and mid-plane portion 24a is mounted on or proximate enclosure top 14a.

In accordance with this described embodiment, each mid-plane portion comprises a number of connectors, such as connectors 26a, which are distributed along the length of the associated mid-plane portion on both sides thereof. In the present example, an individual connector 26a on one of the mid-plane portions is paired with an individual connector 26a on a different mid-plane portion to provide a connector pair, such as connector pair 28a.

In this embodiment, individual connector pairs, such as connector pair 28a, can provide an electrical and mechanical connection for one or more respective devices or blades. That is, in this example, each individual connector 26a is bi-directionally connectable or connected with an associated device or blade. Specifically, as shown in the figure, a first device or blade 30a is connected with connector 26a on first mid-plane portion 22a, and connector 26a on second mid-plane portion 24a. Device or blade 30a is connected with connectors 26a by inserting the device or blade into the enclosure in a first direction indicated by arrow A.

Similarly, a second device or blade 30b is connected with connector 26a on first mid-plane portions 22a, and connector 26a on second mid-plane portion 24a. Device or blade 30b is connected with connectors 26a by inserting the device or blade into the enclosure in a second direction indicated by arrow B. In the illustrated and described embodiment, the directions indicated by the arrows are opposite one another.

As shown, the arrangement of the mid-plane portions of the mid-plane assembly provides connector pairs 28a that are spaced to provide a gap 32a that accommodates airflow through the enclosure, from front-to-back. As shown, air enters through an opening at the front of the enclosure and travels generally along the length of the individual blades towards the connector pairs 28a, through gap 32a between the spaced apart connectors of the connector pairs 28a, and out the back of the enclosure.

The illustrated and described mid-plane assembly can provide a large amount of routing space for routing electrical connections within the mid-plane portions. At the same time, the mid-plane assembly can promote a desirable amount of airflow through the enclosure and can thus reduce the likelihood that the devices or blades will overheat.

Exemplary Pluggable Devices or Blades

Figure 7:
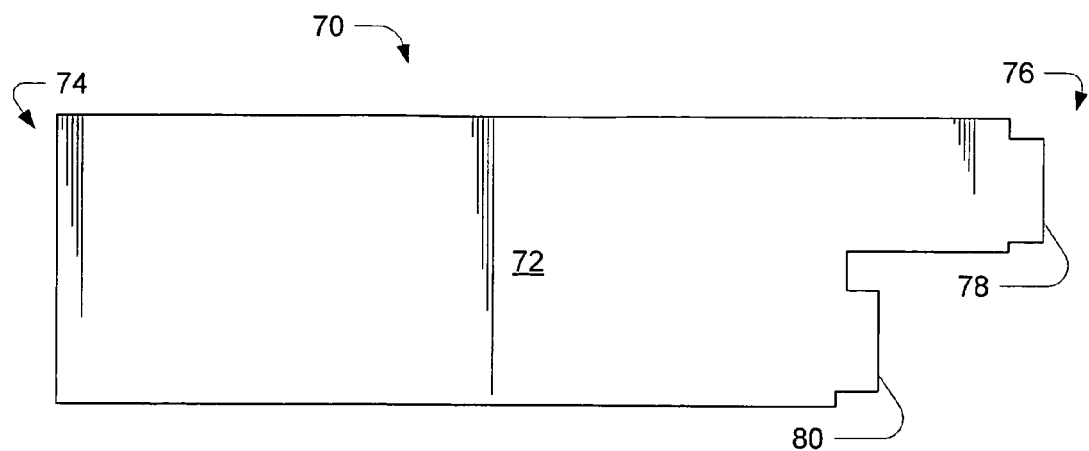
FIG. 7 is a side elevational view of an exemplary device in the form of a blade in accordance with one embodiment.

FIG. 7 shows an exemplary pluggable device in accordance with one embodiment generally at 70. Device 70 can comprise any suitable device such as a blade. Exemplary blades can include, without limitation, server blades, storage blades and/or network blades, to name just a few examples.

In the illustrated and described embodiment, device 70 comprises a device body 72 which extends between first and second ends 74, 76. In the illustrated and described embodiment, first end 74 comprises a grippable end that can be gripped by a user for inserting the device into an enclosure, such as the enclosures shown and described above. Second end 76 comprises a terminus having a pair of offset extensions 78, 80. Individual offset extensions comprise electrical and mechanical structures that are configured to be received by a connector pair, such as connector pair 28 or 28a above, to thereby establish an electrical and mechanical connection between the device and an associated back or mid-plane that supports the connector pair.

In accordance with the described embodiment, the offset extensions 78, 80 are dimensioned such that when the device is mated with a suitably configured back or mid-plane, a gap between individual connectors of a connector pair promotes airflow through the enclosure in which the device resides.

CONCLUSION

In accordance with the embodiments described above, back and mid-plane assemblies are provided in which the back or mid-plane is staggered into two or more portions that are offset within an associated enclosure to accommodate connection with suitably configured devices such as blades. By offsetting the back or mid-plane portions, a gap is provided between the portions and can accommodate airflow through the enclosure. In addition, the back or mid-plane portions can be dimensioned to provide a desirable amount of routing space for routing electrical connections within the back or mid-planes.

Although the invention has been described in language specific to structural features and/or methodological steps, it is to be understood that the invention defined in the appended claims is not necessarily limited to the specific features or steps described. Rather, the specific features and steps are disclosed as preferred forms of implementing the claimed invention.

What is claimed is:

1. A system comprising:
    an enclosure; and
    a plane assembly mounted within the enclosure and configured to connect with multiple pluggable devices, the plane assembly comprising:
    a first plane portion having multiple connectors; and
    at least a second plane portion having multiple connectors, the second plane portion being offset from the first plane portion to define a gap that is dimensioned to promote airflow via the gap through the enclosure; and
    wherein the first plane portion and the at least second plane portion are configured to both connect to each of the multiple pluggable devices.

2. The system of claim 1, wherein said plane portions are elevationally offset within the enclosure.

3. The system of claim 1, wherein said plane portions are longitudinally offset within the enclosure.

4. The system of claim 1, wherein said plane portions are elevationally and longitudinally offset within the enclosure.

5. The system of claim 1, wherein the enclosure has a height and said plane portions have respective heights, and wherein the collective height of the plane portions is about equal to the enclosure height.

6. The system of claim 1, wherein the enclosure has a height and said plane portions have respective heights, and wherein the collective height of the plane portions is about equal to the enclosure height, and wherein the plane portion heights are about equal to one another.

7. The system of claim 1, wherein said plane assembly comprises a back plane assembly.

8. The system of claim 1, wherein said plane assembly comprises a mid-plane assembly.

9. The system of claim 1, wherein the multiple pluggable devices comprise blades.

10. The system of claim 1, wherein the multiple pluggable devices comprise blade servers.

11. The system of claim 1, wherein the plane assembly comprises only the first and second plane portions.

12. A system comprising:
    an enclosure comprising a base, a top and a pair of sidewalls joined with and extending between the base and top to define an interior volume within which multiple pluggable devices can be received, the enclosure having a front and a back;
    a first back plane portion mounted within the enclosure and comprising multiple connectors; and a second beck plane portion mounted within the enclosure end comprising multiple connectors, the second back plane portion being spaced apart from the first back plane portion effective to define a gap that allows air entering from the front of the enclosure to escape at the back of the enclosure via the gap; and wherein the first back plane portion and the second backplane plane portion are configured to both connect to each of the multiple pluggable devices.

13. The system of claim 12, wherein the first and second back plane portions are longitudinally and elevationally spaced apart within the enclosure.

14. The system of claim 12, wherein the enclosure has a height between the base and the top, and the first and second back plane portions have respective heights, wherein the collective height of the back plane portions is about equal to the enclosure height.

15. The system of claim 12, wherein the enclosure has a height between the base and the top, and the gap has a gap width between the first and second back plane portions that is no less than about one half of the enclosure height.

16. The system of claim 12, wherein the multiple pluggable devices comprise blades.

17. The system of claim 12, wherein the multiple pluggable devices comprise blade servers.

18. A system comprising:
an enclosure;
a mid-plane assembly mounted within the enclosure and configured to connect with multiple pluggable devices, the mid-plane assembly comprising:
 a first mid-plane portion having multiple connectors on both skies thereof; and
at least a second mid-plane portion having multiple connectors on both sides thereof, the second mid-plane portion being offset from the first mid-plane portion; and
wherein the first mid-plane portion and the at least second mid-plane portion are configured to both connect to each of the multiple pluggable devices.

19. The system of claim 18, wherein said mid-plane portions are elevationally and longitudinally offset within the enclosure.

20. The system of claim 18, wherein the enclosure has a height and said mid-plane portions have respective heights, and wherein the collective height of the mid-plane portions is about equal to the enclosure height.

21. An apparatus comprising:
a first grippable end;
a second end spaced from the first end;
a body that extends between the first and second end;
the second end comprising a terminus having a pair of offset extensions, individual offset extensions comprising electrical and mechanical structures that are configured to be received by a connector pair comprising individual connectors mounted on spaced-apart plane portions which are spaced apart to define a gap between the individual plane portions to accommodate airflow via the gap through an enclosure in which the plane portions are mounted.

22. The apparatus of claim 21, wherein the offset extensions are configured to be received by a connector pair of a back plane.

23. The apparatus of claim 21, wherein the offset extensions are configured to be received by a connector pair of a mid-plane.

24. A method comprising:
providing an enclosure; and
mounting a plane assembly within the enclosure by mounting a first plane portion having multiple connectors within the enclosure and mounting a second plane portion having multiple connectors within the enclosure;
the second plane portion being offset from the first plane portion to define a gap that is dimensioned to promote airflow via the gap through the enclosure, the plane assembly being configured to connect with multiple pluggable devices, wherein the first plane portion and the second plane portion are configured to both connect to each of the multiple pluggable devices.

25. The method of claim 24, wherein said acts of mounting comprise elevationally and longitudinally offsetting said plane portions within the enclosure.

* * * * *

UNITED STATES PATENT AND TRADEMARK OFFICE
CERTIFICATE OF CORRECTION

PATENT NO.       : 7,092,253 B2                                              Page 1 of 1
APPLICATION NO.  : 10/816696
DATED            : August 15, 2006
INVENTOR(S)      : An Hien Lam It is certified that error appears in the above-identified patent and that said Letters Patent is hereby corrected as shown below:

On the Title Pg, Item (73), in "Assignee", line 2, delete "LP.," and insert -- L.P., --, therefor.

In column 7, line 1, in Claim 12, delete "beck" and insert -- back --, therefor.

In column 7, line 2, in Claim 12, delete "end" and insert -- and --, therefor.

In column 7, line 8, in Claim 12, delete "backplane" and insert -- back --, therefor.

In column 7, line 32, in Claim 18, delete "skies" and insert -- sides --, therefor.

Signed and Sealed this

Twenty-eighth Day of July, 2009

JOHN DOLL
*Acting Director of the United States Patent and Trademark Office*